United States Patent [19]

Okada et al.

[11] Patent Number: 5,307,503
[45] Date of Patent: Apr. 26, 1994

[54] SHIELDED CIRCUIT MODULE WITH TERMINAL PINS ARRAYED ON FOUR SIDES FOR CONNECTION TO A COMPUTER BOARD

[75] Inventors: Isao Okada; Yoshiyuki Kato, both of Atsugi; Koji Ide; Toshihiko Yasuma, both of Fujisawa, all of Japan; Richard G. Geiger, Saratoga; Akio Tanaka, Burlingame, both of Calif.; Ryuichi Sada, Yamato; Mikito Baba, Yokohama, both of Japan

[73] Assignee: Mitsumi Electric Co., Ltd., Japan

[21] Appl. No.: 544,605

[22] Filed: Jun. 27, 1990

[30] Foreign Application Priority Data

Jul. 3, 1989 [JP] Japan .................................. 1-171715

[51] Int. Cl.⁵ .............................. G06F 1/16; G06F 1/18
[52] U.S. Cl. ................................... 395/800; 364/DIG. 2; 364/927.83; 364/929.4; 361/683; 361/684; 361/816; 361/730
[58] Field of Search .................. 364/DIG. 1, DIG. 2; 395/275, 325, 800; 361/392–406, 380, 409, 412, 413, 414, 421, 424

[56] References Cited

U.S. PATENT DOCUMENTS

| | | | |
|---|---|---|---|
| 4,129,897 | 12/1978 | Telewski et al. | 361/399 |
| 4,468,727 | 8/1984 | Carrison et al. | 395/800 |
| 4,513,354 | 4/1985 | Abel | 361/399 |
| 4,661,886 | 4/1987 | Nelson et al. | 361/400 |
| 4,705,917 | 11/1987 | Gates, Jr. et al. | 361/401 |
| 4,774,635 | 9/1988 | Greenberg et al. | 361/404 |
| 4,797,808 | 1/1989 | Bellay et al. | 395/800 |
| 4,891,686 | 1/1990 | Krausse, III | 361/400 |
| 4,903,113 | 2/1990 | Frankeny et al. | 361/406 |
| 4,903,167 | 2/1990 | Lichtensperger | 361/395 |
| 4,903,167 | 2/1990 | Lichtensperger | 361/395 |
| 5,065,282 | 11/1991 | Pozonio | 361/399 |
| 5,147,982 | 9/1992 | Steffen | 361/406 |

FOREIGN PATENT DOCUMENTS 0184464 6/1985 European Pat. Off. .
0237894 7/1987 European Pat. Off. .

OTHER PUBLICATIONS

Ralston et al, Encyclopedia of Computer Science, 1976 pp. 712–716.

Primary Examiner—Thomas C. Lee
Assistant Examiner—John C. Loomis
Attorney, Agent, or Firm—Andrus, Sceales, Starke & Sawall

[57] ABSTRACT

A circuit module includes one or a plurality of semiconductor parts, a substrate having the semiconductor parts mounted thereon, and terminals arranged on an outer periphery of the substrate along a plurality of sides of said substrate. The circuit module is connected to a board of a computer by plugging the terminals into corresponding terminal holes, so that the terminals are used in common for providing electrical connection and mechanical connection with the board of the computer.

4 Claims, 11 Drawing Sheets

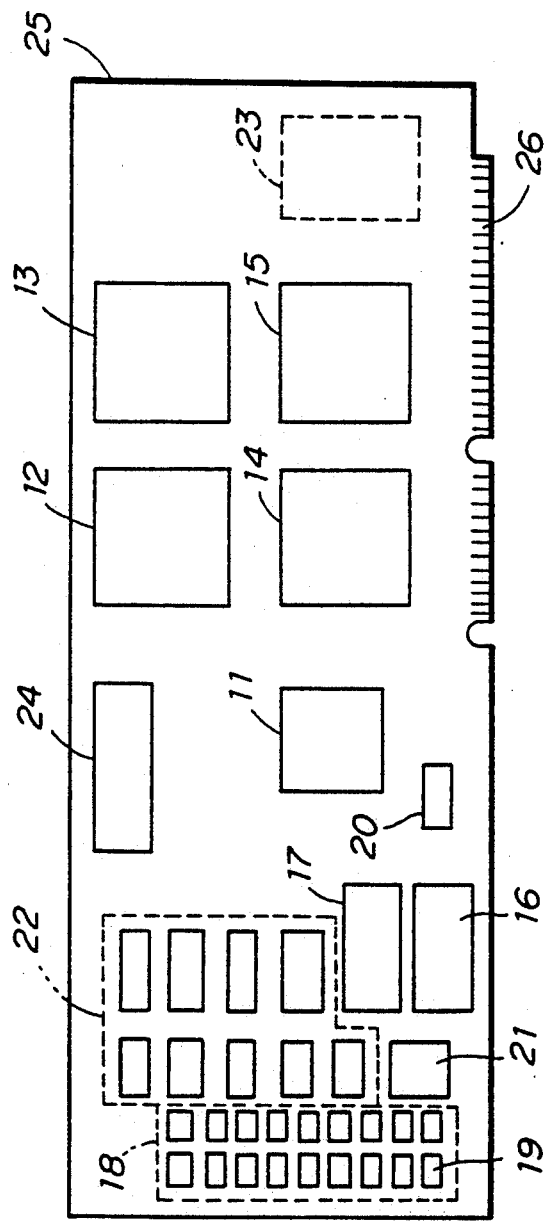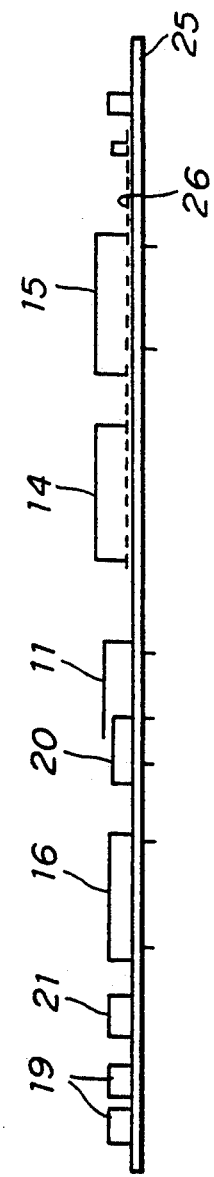

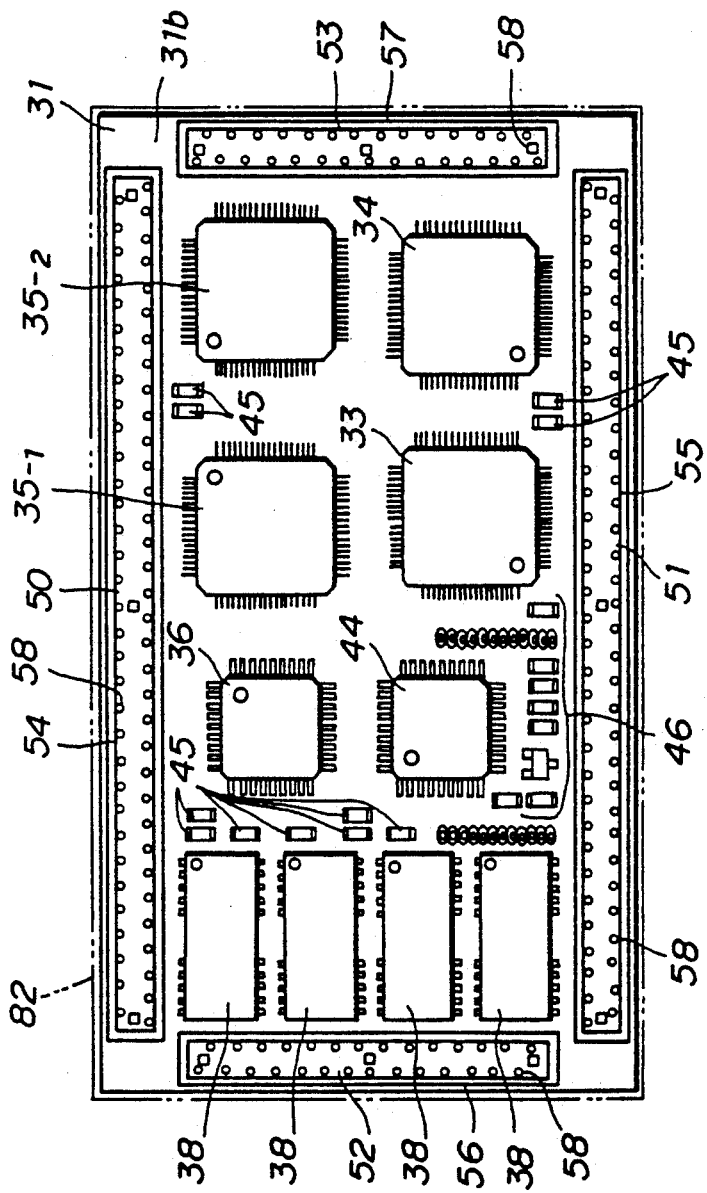

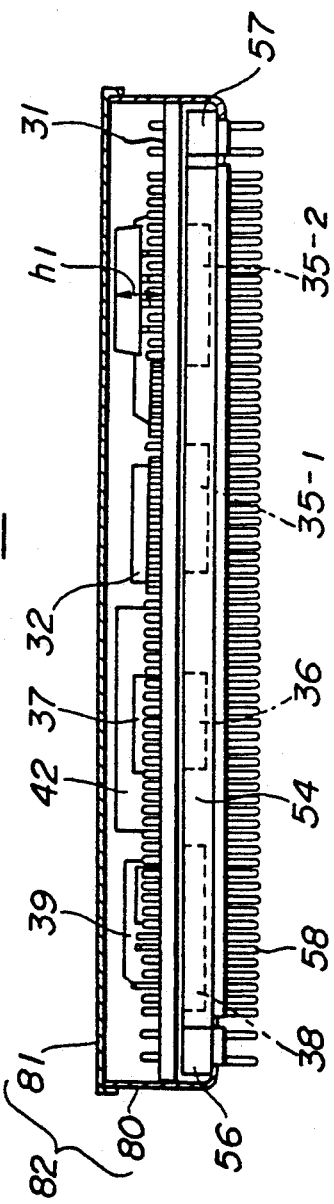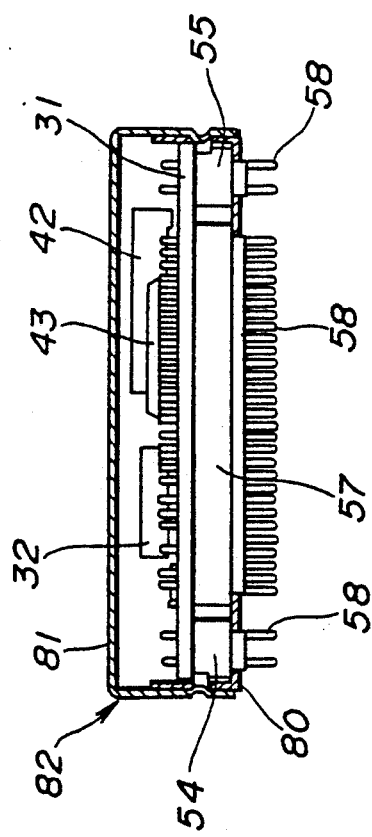

SHIELDED CIRCUIT MODULE WITH TERMINAL PINS ARRAYED ON FOUR SIDES FOR CONNECTION TO A COMPUTER BOARD

BACKGROUND OF THE INVENTION

The present invention generally relates to circuit modules having electric circuits in a form of a module.

Conventionally, electric circuits are provided on a circuit board, and a computer board manufactured by Micromint is an example of such a circuit board. This computer board has a group of terminals provided along only one side of the computer board. For this reason, there is a problem in that the size of the computer board is approximately 330 mm×120 mm which is relatively large.

Another example of such a circuit board has extended memories of a computer on a circuit board. This extended memory board has a group of terminals provided along only one side of the extended memory board, and the size thereof is large.

FIGS. 1 and 2 show an example of a conventional a computer board 10 manufactured by Micromint. In FIGS. 1 and 2, the computer board 10 has mounted thereon a central processing unit (CPU) 11, a first POACH (PC On A Chip, trademark) 12 manufactured by Zymos, a second POACH 13, third POACHs 14 and 15, a basic input output system read only memories (BIOS-ROMs) 16 and 17, a memory 18 made up of eighteen 256 kbit dynamic random access memories (DRAMs) 19, a bipolar programmable read only memory (PROM) 20, a delay line 21, an integrated circuit group 22 for producing access timings, for example, a calendar circuit part 23, and a keyboard controller 24. All of these elements of the computer board 10 are mounted on only a top surface of a board 25. A terminal group 26 is provided along one side of the board 25.

The POACHs 12 through 15 are integrated circuits (ICs). For example, the POACHs 12 and 13 are peripheral controller chips, the POACH 14 is an address buffer chip, and the POACH 15 is a data buffer chip.

The computer board 10 is assembled into a computer (not shown) by plugging in the terminal group 26 to a connector (not shown) and inserting the computer board 10 in an upright position.

FIGS. 3 and 4 show the first POACH 12. The first POACH 12 has a stage 100, a plurality of leads 101, a semiconductor chip 102, a plurality of wires bonded to connect chip 102 and the leads 101, and a synthetic resin-formed package portion 104. Each lead 101 has a shape such that the inner end thereof is narrow and the outer end thereof is wide. A length $L_2$ of each lead 101 is about 8 mm which is approximately four times a length $L_1$ of the wire 103 which is about 2 mm. For this reason, the size of the first POACH 12 is 29 mm×29 mm which is relatively large. A thickness $t_1$ of the first POACH 12 is 3.9 mm.

SUMMARY OF THE INVENTION

Accordingly, it is a general object of the present invention to provide a novel and useful circuit module in which the problems described above are eliminated.

Another and more specific object of the present invention is to provide a circuit module having terminals provided along a plurality of sides of a substrate. According to the circuit module of the present invention, it is possible to provide a large region for providing the terminals and a large number of terminals can be provided even when the size of the substrate is small, because the terminals are arranged along the plurality of sides of the substrate.

Other objects and further features of the present invention will be apparent from the following detailed description when read in conjunction with the accompanying drawings.

BRIEF DESCRIPTION OF THE DRAWINGS

FIG. 1 is a plan view showing an example of a conventional computer module;

FIG. 2 is a front view of the conventional computer module shown in FIG. 1;

FIG. 6 is a bottom view of the computer module shown in FIG. 5;

FIG. 7 is a front view in partial cross section showing the computer module shown in FIG. 5 accommodated within a case;

FIG. 8 is a side view in a partial cross section showing the computer module shown in FIG. 5 accommodated within the case;

DESCRIPTION OF THE PREFERRED EMBODIMENTS

Figure 5:
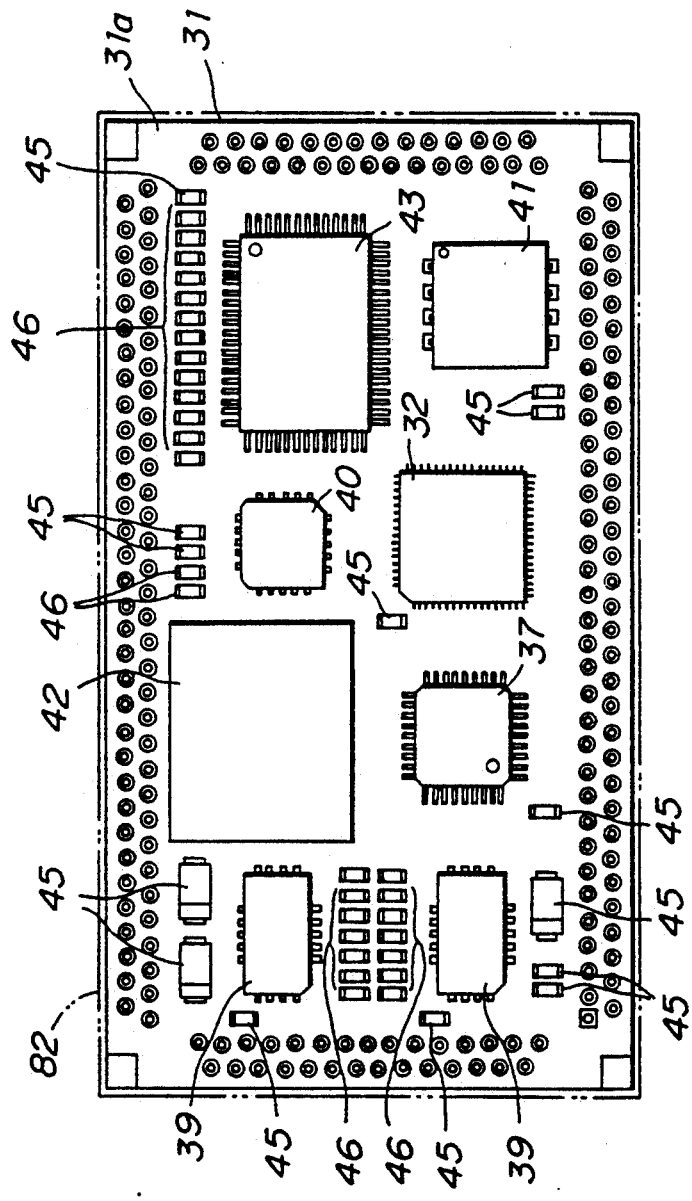
FIG. 5 is a plan view showing an embodiment of a circuit module according to the present invention.

A description will be given of an embodiment of a circuit module according to the present invention. In this embodiment, the present invention is applied to a computer module. First, a description will be given of a basic structure of the computer module. FIGS. 5 and 6 respectively are a plan view and a bottom view of a computer module 30. As will be described later in the specification, the computer module 30 is accommodated within a case.

The computer module 30 has various electronic parts mounted on both top and bottom surfaces of a single substrate, and terminal groups are arranged in a periphery of the substrate. As a result, the computer module 30 has a compact structure.

A rectangular substrate 31 has a small size of 98 mm×55 mm which is approximately the size of a compact cassette. A CPU 32 corresponds to the CPU 11 shown in FIG. 1 and is mounted at an approximate center on a top surface 31a of the substrate 31. A first POACH 33, a second POACH 34 and third POACHs 35-1 and 35-2 respectively correspond to the POACHs 12, 13, 14 and 15 shown in FIG. 1. The POACHs 33, 34, 35-1 and 35-2 are arranged in a rectangular shape and are mounted at a portion on the right from the center of a bottom surface 31b of the substrate 31. The POACHs 33, 34, 35-1, 35-2 are ICs as described above. Each of the POACHs 33, 34, 35-1, 35-2 can be replaced by DRAMs and the like with minor circuit modifications. The POACHs 33, 34, 35-1 and 35-2 respectively have a molded resin portion having a side of approximately 14 mm which is approximately ½ that of the conventional POACH, and the POACHs 33, 34, 35-1 and 35-2 are miniaturized in that the area occupied thereby is approximately ¼ that occupied by the conventional POACH.

A BIOS-ROM 36 corresponds to the BIOS-ROM 16 shown in FIG. 1 and is mounted on the bottom surface 31b of the substrate 31. A BIOS-ROM 37 corresponds to the BIOS-ROM 17 shown in FIG. 1 and is mounted on the top surface 31a of the substrate 31. The BIOS-ROMs 36 and 37 are located at the same position of the substrate 31 on the respective bottom and top surfaces 31b and 31a. For this reason, it is possible to use a common internal wiring on the substrate 31 for the BIOS-ROMs 36 and 37, and the internal wiring can be made simple.

Four 256×4 kbit (1 Mbit) DRAMs 38 are mounted at a portion on the left from the center of the bottom surface 31b of the substrate 31. Two 256 kbit DRAMs 39 are mounted at a portion on the left from the center of the top surface 31a of the substrate 31. That is, the DRAMs 38 and 39 are located at approximately the same position of the substrate 31 on the respective bottom and top surfaces 31b and 31a. The total of six DRAMs 38 and 39 correspond to the eighteen DRAMs 19 shown in FIG. 1.

A bipolar PROM 40 corresponds to the bipolar PROM 20 shown in FIG. 1. This bipolar PROM 40 is mounted on the top surface 31a of the substrate 31. A delay line 41 corresponds to the delay line 21 shown in FIG. 1. Because a height h of the delay line 41 is relatively large, the delay line 41 is mounted on the top surface 31a of the substrate 31.

A calendar module 42 corresponds to the calendar circuit part 23 shown in FIG. 1. The calendar module 42 is mounted on the top surface 31a of the substrate 31. This calendar module 42 has a hybrid integrated circuit structure, and is miniaturized in that an area occupied by the calendar module 42 is approximately 1/6 that occupied by the calendar circuit part 23.

A custom integrated circuit (IC) 43 is mounted on the top surface 31a of the substrate 31. The custom IC 43 is obtained by customizing the integrated circuit group 22 shown in FIG. 1 into a single integrated circuit, and the custom IC 43 is miniaturized in that an area occupied by the custom IC 43 is approximately 1/10 that occupied by the integrated circuit group 22.

A keyboard controller 44 corresponds to the keyboard controller 24 shown in FIG. 1. The keyboard controller 44 is mounted on the bottom surface 31b of the substrate 31, and the keyboard controller 44 is miniaturized in that the size thereof is approximately ⅓ that of the keyboard controller 24. A plurality of chip capacitors 45 and a plurality of chip resistors 46 are distributed and mounted on the top and bottom surfaces 31a and 31b of the substrate 31.

The POACHs 35-1 and 35-2, the BIOS-ROMs 36 and 37, the DRAMs 38 and 39 and the custom IC 43 constitute a memory circuit part. On the other hand, the POACHs 33 and 34, the calendar module 42 and the keyboard controller 44 constitute a control circuit part.

Pin terminal assemblies 50, 51, 52 and 53 are respectively made up of columnar blocks 54 through 57 which are made of a synthetic resin and have an approximate rectangular cross section and pin terminals 58 which are embeddedly provided and penetrate the blocks 54 through 57. Upper portions of the pin terminals 58 projecting upwardly from the blocks 54 through 57 of each of the pin assemblies 50 through 53 are inserted into corresponding through holes of the substrate 31 and fixed by soldering. The blocks 54 through 57 make contact with the bottom surface 31b of the substrate 31 and are provided along all of the four sides of the substrate 31.

Figure 9:
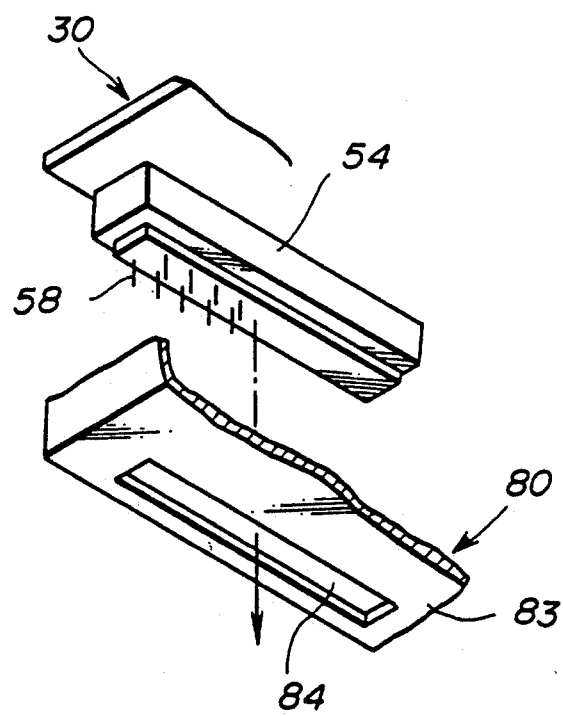
FIG. 9 is a perspective view for explaining a relationship of a pin terminal assembly of the computer module and an elongated opening of the case.

As shown in FIGS. 7 and 8, the computer module 30 is accommodated within a case 82 and is shielded in a state where only the pin terminals 58 project from the case 82. The case 82 is made up of a metal case portion 80 and a lid portion 81. As shown in FIG. 9, elongated openings 84 are provided along the four sides of a bottom plate portion 83 of the case portion 80. As may be seen from FIGS. 7, 8 and 9, the pin terminals 58 project from the peripheral portion of the bottom surface of the case 82 through the elongated openings 84.

The computer module 30 accommodated within the case 82 may be handled like a general integrated circuit chip, as a main element of a main personal computer body and the like. When using the computer module 30, the pin terminals 58 are plugged into terminal holes (not shown) of a board (not shown) of the main personal computer body and the like. In other words, the pin terminals 58 are used in common for providing electrical connection and mechanical connection with the board of the main personal computer body, and there is no need to provide special mechanisms to mechanically connect the computer module 30 to the board of the main personal computer body. The mechanical connection between the computer module 30 and the board of the main personal computer body is particularly stable and satisfactory when the pin terminals 58 are provided at mutually confronting sides of the substrate 31.

The CPU 32 has a main role in the computer module 30 and is arranged at the approximate center of the substrate 31 because the wiring is concentrated in the vicinity of the CPU 32. In addition, a quantity of heat generated by the CPU 32 is relatively large, and for this reason, the CPU 32 is provided on the top surface 31a of the substrate 31.

The POACHs 33, 34, 35-1 and 35-2 are concentrated in the same portion of the substrate 31. Hence, when printing solder pastes at portions of the substrate 31 where the POACHs 33, 34, 35-1 and 35-2 are to be mounted, it is possible to use the same printing condition for all of the portions. In addition, when passing the substrate 31 through a reflow reactor, it is possible to carry out the soldering of the POACHs 33, 34, 35-1 and 35-2 under the same condition. Furthermore, it is easy to mount the POACHs 33, 34, 35-1 and 35-2.

On the other hand, the POACHs 33, 34, 35-1 and 35-2 are arranged at a portion immediately below the CPU 32, and the internal wiring on the substrate 31 for connecting the CPU 32 and the POACHs 33, 34, 35-1 and 35-2 can be made short. As a result, a waveform distortion is reduced and an unwanted radiation is also reduced. Moreover, in the plan view, the CPU 32 is located inside a region in which the POACHs 33, 34, 35-1 and 35-2 are located, and the CPU 32 and the POACHs 33, 34, 35-1 and 35-2 are mounted with a high density.

The DRAMs 38 and 39 have a relatively small number of connections with the CPU 32. For this reason, the DRAMs 38 and 39 are arranged in a vicinity of the edge of the substrate 31. The pin terminals 58 are provided along the periphery of the substrate 31. The size of the substrate 31 is small, but the total length around the outer periphery is approximately 300 mm and sufficiently large. Thus, although the number of the pin terminals 58 is 192 and relatively large in this embodiment, it is possible to provide all of the pin terminals 58 in two rows. In addition, since the pin terminals 58 are provided only at the peripheral portion of the substrate 31, the space excluding the peripheral portion of the substrate 31 can be used for mounting the electronic parts and the space utilization efficiency of the substrate 31 for the mounting of the electronic parts is high.

Next, a description will be given of the personal computer to which the computer module 30 may be applied together with a description of a circuit construction of the computer module 30.

Figure 10:
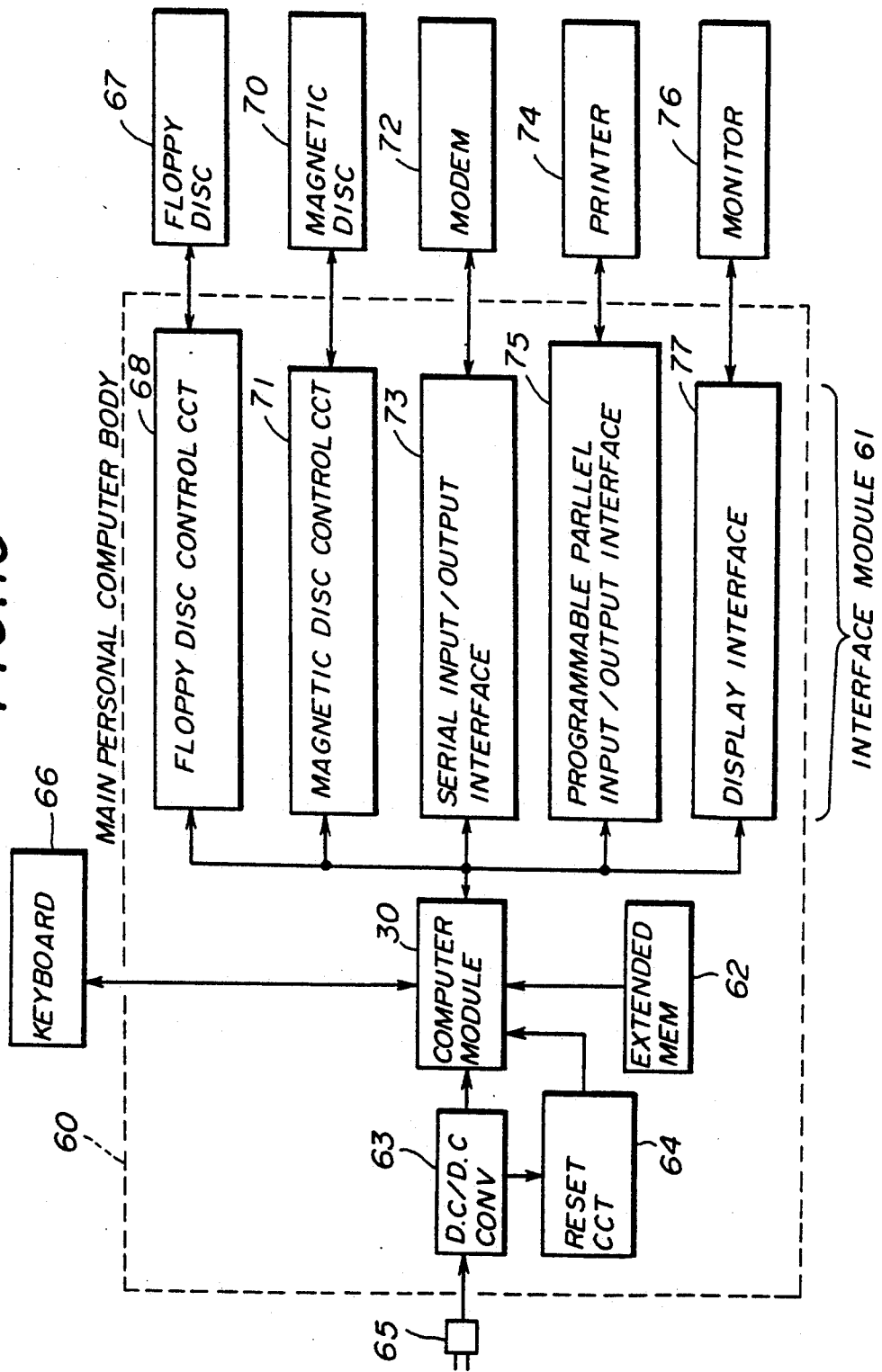
FIG. 10 is a system block diagram showing a general personal computer to which the computer module shown in FIGS. 5 and 6 may be applied.

FIG. 10 shows a system structure of a general personal computer to which the computer module 30 may be applied. In FIG. 8, a main personal computer body 60 includes the computer module 30, an interface module 61 for controlling input and output with respect to an external device (not shown), an extended memory 62, a D.C./D.C. converter 63, and a reset circuit 64. The computer module 30 is provided with external terminals and receives a power source voltage from an A.C. adapter 65 through the D.C./D.C. converter 63. In addition, the computer module 30 receives various information from a keyboard and external device 66 and carries out various operations.

The interface module 61 has a floppy disc control circuit 68 for carrying out a control with respect to a floppy disc 67, a magnetic disc control circuit 71 for carrying out a control with respect to a magnetic disc 70, a serial input/output interface 73 for controlling input/output with respect to a modem 72, a programmable parallel input/output interface 75 for controlling input/output with respect to a printer 74, and a display interface 77 for controlling input/output with respect to a monitor 76.

Figure 11:
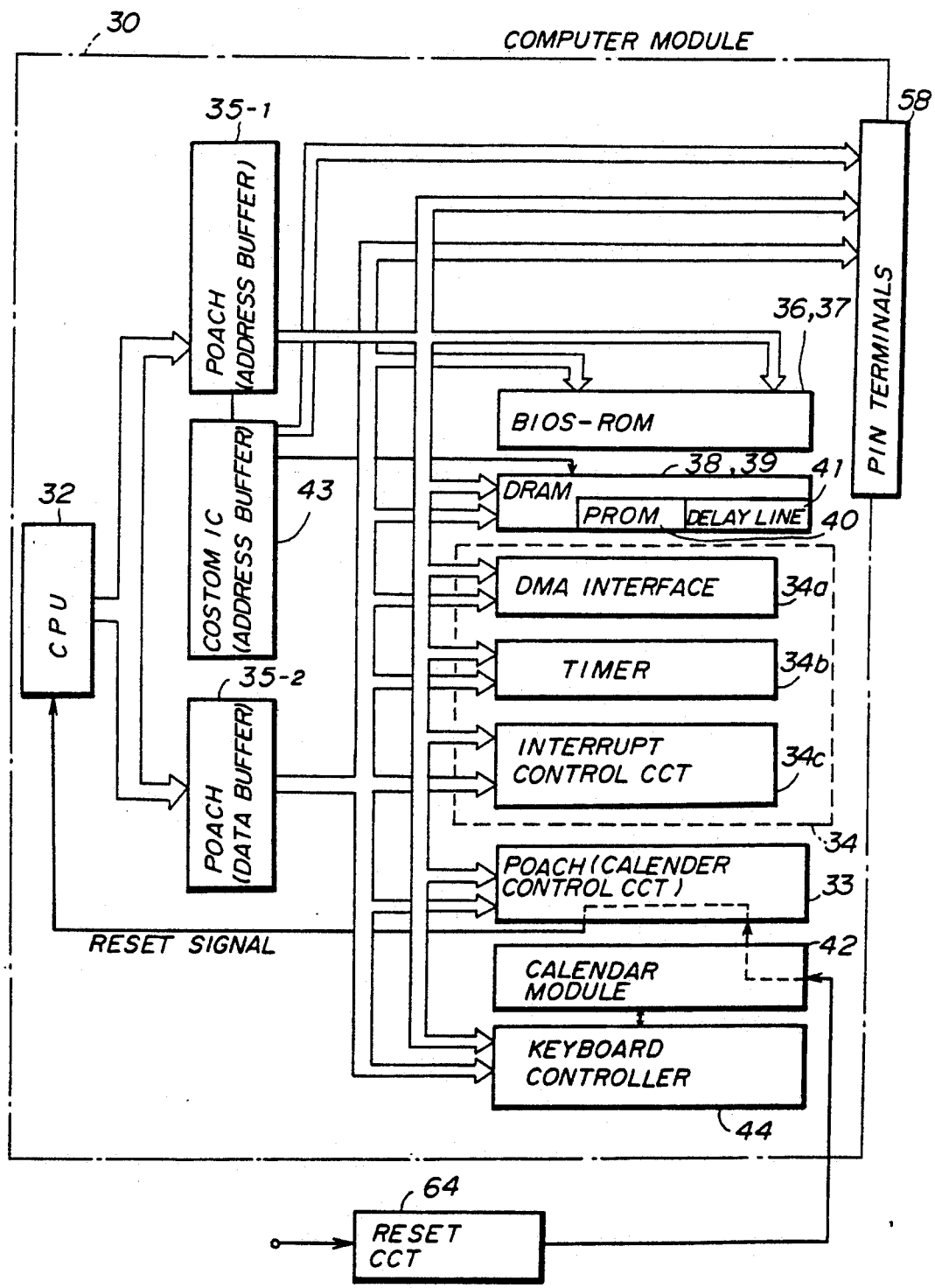
FIG. 11 is a system block diagram showing the computer module shown in FIGS. 5 and 6.

FIG. 11 shows a circuit construction of the computer module 30 shown in FIG. 10. The basic functions of the computer module 30 is similar to that of the conventional computer module, and only a general description will be given of the computer module 30. In FIG. 11, the CPU 32 controls the entire computer module 30 and carries out a control depending on a predetermined program. The POACH 35-1 is an address buffer used for buffering an address designated by the CPU 32, and this address is used to designate the addresses of the DRAMs 38 and 39, the BIOS-ROMs 36 and 37 and the like The POACH 35-2 is a data buffer used for buffering a data output under the control of the CPU 32, and this data is supplied to an external circuit wherein a predetermined processing takes place through various circuits within the computer module 30 and the pin terminals 58.

Access timing signals generated by the custom IC 43 are used when driving the DRAMs 38 and 39. The addresses of the DRAMs 38 and 39 are designated with access timings determined by the delay line 41 based on the access timing signals. The bipolar PROM 40 makes the so-called memory allocation depending on this access.

The POACH 34 has a direct memory access (DMA) interface 34a, a timer 34b for generating a processing time for synchronizing hardware and software operations, and an interrupt control circuit 34c. The calendar module 42 has a crystal oscillator which generates a clock signal for keeping the time for displaying the date, and this clock signal is supplied to a calendar control circuit of the POACH 33 so as to display the date. The keyboard controller 44 operates as an interface for keyboard control by entering a designation signal from the external keyboard into predetermined circuits within the computer module 30 and outputting a control signal from the CPU 32 to the keyboard.

In the described embodiment, the pin terminals 58 are provided at all of the four sides of the substrate 31, but it is of course possible to provide the pin terminals 58 at only two or three arbitrary sides of the substrate 31.

Figure 3:
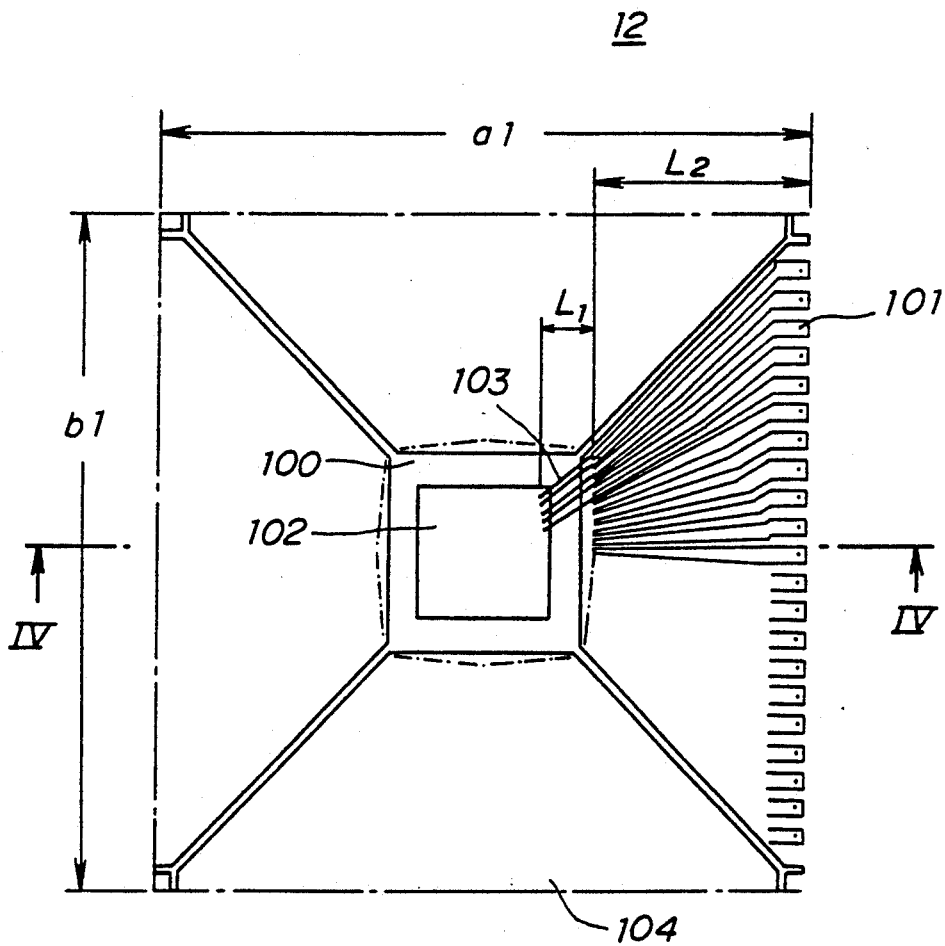
FIG. 3 is a plan view showing one POACH (PC On A Chip, trademark) shown in FIGS. 1 and 2 in a state where a package portion is omitted.
Figure 4:
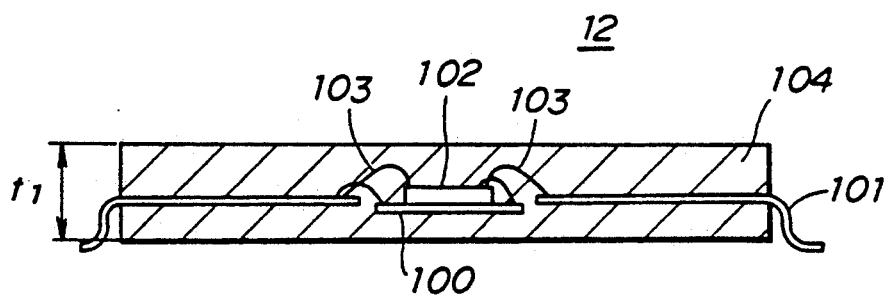
FIG. 4 is a cross-sectional view taken along a line IV—IV in FIG. 3.
Figure 12:
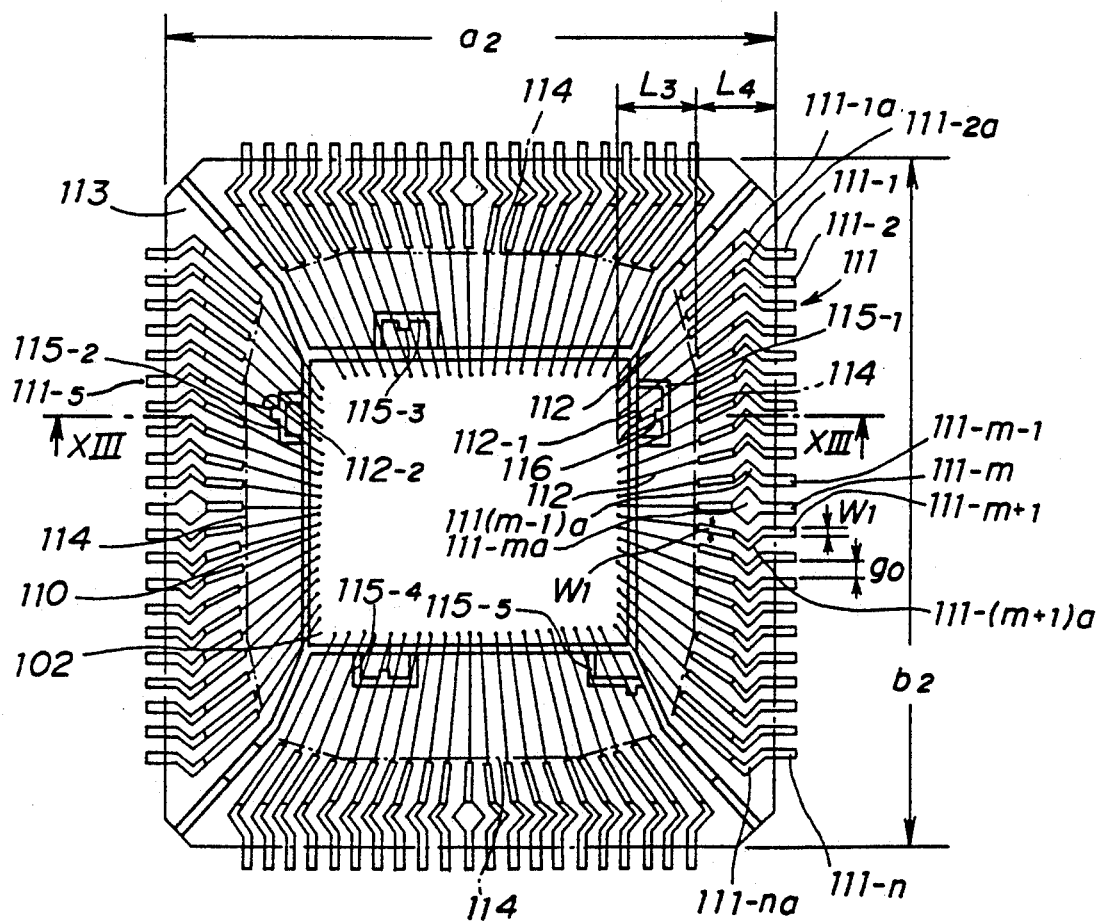
FIG. 12 is a plan view showing one POACH shown in FIG. 6 in a state where a package portion is omitted.
Figure 13:
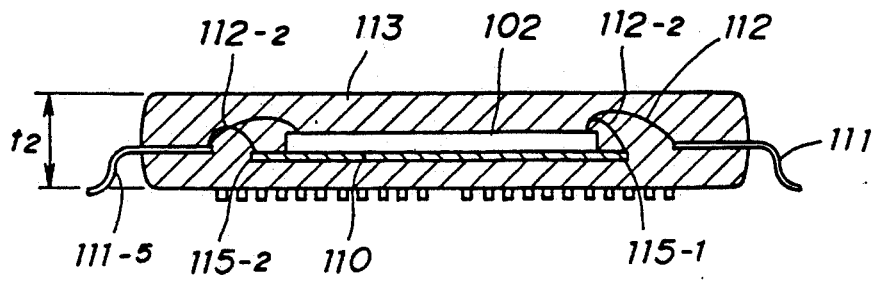
FIG. 13 is a cross-sectional view taken along a line XIII—XIII in FIG. 12.

Next, a description will be given of a structure of the first POACH 33. FIGS. 12 and 13 show a structure of the POACH 33. In FIGS. 12 and 13, those parts which are essentially the same as those corresponding parts in FIGS. 3 and 4 are designated by the same reference numerals, and a description thereof will be omitted. FIGS. 12 and 13 hows the POACH 33 on a large scale which is two times that of FIGS. 3 and 4.

The POACH 33 has a stage 100, a semiconductor chip 102 bonded on the stage 100, a plurality of leads 111, wires 112 bonded to pads on the semiconductor chip 102 and tips of the leads 111, and a synthetic resin-formed package portion 113. A length $L_3$ of the wire 112 is determined by the specifications of a wire bonder, and is about 2 mm which is a normal value for a common semiconductor device. A length $L_4$ of the lead 111 is about 2 mm which is approximately the same as the length $L_3$ of the wire 112. For this reason, the size $a_2 \times b_2$ of the POACH 33 is 14 mm—14 mm which is reduced to approximately ¼ the POACH 12 of the prior art.

If FIG. 12 is reduced to a size such that the semiconductor chip 102 shown in FIG. 12 becomes the same size as the semiconductor chip 102 shown in FIG. 3, it will be understood from a comparison with FIG. 3 that the size of the POACH 33 is considerably smaller than that of the POACH 12 of the prior art. A thickness $t_2$ of the POACH 33 is 2.5 mm which is thinner than the POACH 12 of the prior art. The lead 111 has a shape such that a width thereof is approximately the same over the total length of the lead 111. A width $w_1$ of the lead 111 is 0.18 mm.

For this reason, even if each side of the POACH 33 is 14 mm in length which is reduced to ¼ the length of the side of the POACH 12 of the prior art, a gap $g_0$ of 0.32 mm which is sufficient for preventing a short-circuit is provided between adjacent leads 111.

The lead 111-1 located at the center of the side of the POACH 33 has a diamond-shaped portion 111-*ma*. The other leads 111-1 through 111-*n* have V-shaped portions 111-1*a* through 111-*na* which are formed along the sides of the diamond-shaped portion 111-*ma* and arranged symmetrically with respect to the center lead 111-*m*. Accordingly, the portions 111-1*a* through 111-(*m*−1)*a* of the leads 111-1 through 111-(m−1) have upside-down V-shapes and the portions 111-(m+1)*a* through 111-*na* of the leads 111-*m*+1 through 111-*n* have normal V-shapes in FIG. 12.

The diamond-shaped portion 111-*ma* and the V-shaped portions 111-1*a* through 111-*na* make it difficult to the leads 111 to come off the package portion 113 even when a pulling force acts on the leads 111. Thus, although the leads 111 would easily come off the package portion 113 when the length of the leads 111 is shortened, the diamond-shaped portion 111-*ma* and the V-shaped portions 111-1*a* through 111-*na* compensate for the shortened length of the leads 111. In addition, the diamond-shaped portion 111-*ma* and the V-shaped portions 111-1*a* through 111-*na* lengthen a distance along the edge of the lead 111, thereby making it difficult for moisture to intrude into the package portion 113 along the lead 111 toward the portion where the wires 112 are bonded.

The leads 111 are arranged so that a line 114 connecting the inner ends of the leads 111 curves towards the center of the stage 110 at portions corresponding to the corner portions of the stage 110. For this reason, the lengths of the wires 112 which connect the leads 111 along one side of the POACH 33 are approximately the same, thus making it easy to make the wire bonding process.

Next, a description will be given of the stage 110. The size of the stage 110 is approximately the same as that of the semiconductor chip 102. At several parts along an outer periphery of the stage 110, there are provided extension portions 115-1 through 115-5 which extend from the stage 110 in a U-shape and form openings therein. Among the pads on the semiconductor chip 102, a pad 116 to be grounded is bonded to a wire 112-1 and is grounded by way of the wire 112-1 and the U-shaped extension portion 115-1. A lead 111-5 to be grounded is connected to the U-shape extension portion 115-2 through a wire 112-2. By providing the U-shaped extension portions 115-1 through 115-5, the size of the stage 110 is reduced to a minimum size which is substantially the same as that of the semiconductor chip 102. For this reason, the thermal distortion due to a difference in the coefficients of thermal expansion of the package portion 113 and the stage 110 is suppressed to a minimum, and the adverse influence of the thermal distortion is thereby suppressed.

Due to the above described size and shape of the stage 110, even if the package portion 113 is smaller and thinner than those of the prior art, a sufficient reliabilty can still be obtained.

Other POACHs 34, 35-1 and 35-2 have a structure which is substantially the same as that of the POACH 33 described above.

The CPU 32 can have a structure identical to that of the POACH 33.

Figure 14:
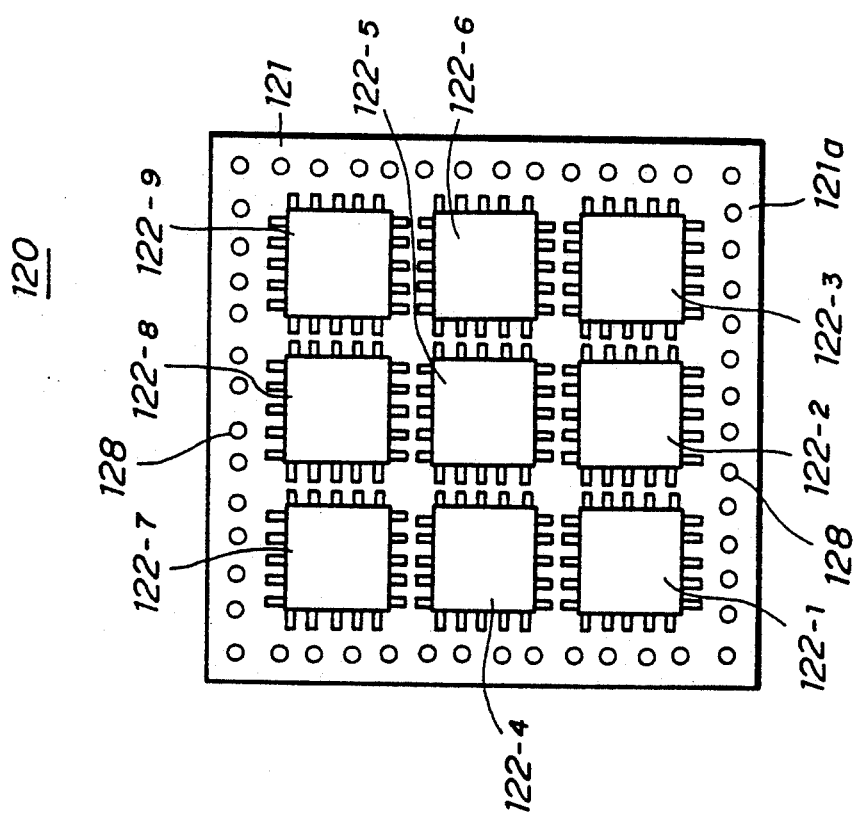
FIG. 14 is a plan view showing another embodiment of the circuit module according to the invention.
Figure 15:
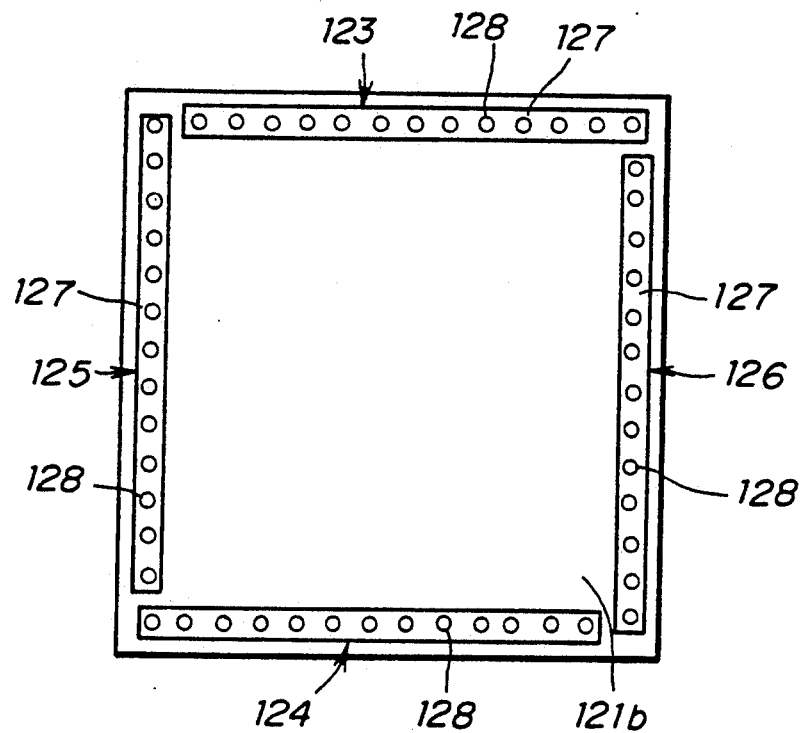
FIG. 15 is a bottom view of the memory module shown in FIG. 14.
Figure 16:
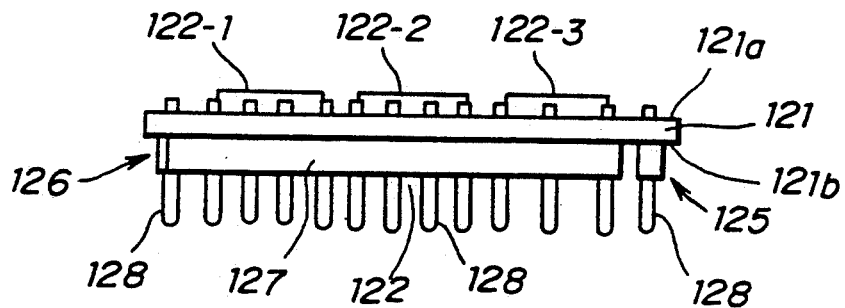
FIG. 16 is a front view of the memory module shown in FIG. 14.

FIGS. 14, 15 and 16 show another embodiment of the circuit module according to the present invention. In this embodiment, the present invention is applied to a memory module. In a memory module 110, a square substrate 121 has nine 256 kbit DRAMs 122-1 through 122-9 mounted on top surface 121*a* thereof. DRAMs 122-1 through 122-9 have a small size of approximately 7 mm×7 mm and are arranged within a square region in three columns each of which has three DRAMs.

Pin terminal assemblies 123, 124, 125 and 126 are respectively made up of columnar blocks 127 which are made of a synthetic resin and have an approximate rectangular cross section and pin terminals 128 which are embeddedly provided and penetrate the blocks 127. Upper portions of the pin terminals 128 projecting upwardly from the blocks 127 of each of the pin assemblies 123 through 126 are inserted into corresponding through holes of the substrate 121 and fixed by soldering. The blocks 127 make contact with the bottom surface 121*b* of the substrate 121 and are provided along all of the four sides of the substrate 121.

Because the DRAMs 122-1 through 122-8 have a small size and are arranged in line in the horizontal and vertical directions and the pin terminals 128 are provided along all the four sides of the substrate 121, the memory module 120 has a small size of 35 mm×35 mm.

This memory module 120 is used as an extended memory of the computer module 30 described above. The memory module 121 is mounted on the board (not shown) on which the computer module 30 is mounted, by plugging the pin terminals 128 into the terminal holes (not shown) of the board, similarly as in the case of the computer board 30 described above.

Further, the present invention is not limited to these embodiments, but various variations and modifications may be made without departing from the scope of the present invention.

What is claimed is:

1. A circuit module connectable to a board in a computer comprising:

at least one semiconductor part;

a substrate having a rectangular shape, said semiconductor part being mounted on said substrate;

terminals arranged on an outer periphery of said substrate along four sides of said substrate;

a case, having a case portion and a lid portion, for accommodating and shielding said substrate, one of said case portion and said lid portion having elongated openings for exposing said terminals; and wherein:

said semiconductor part includes a central processing unit, a memory circuit part, and a control circuit part, said semiconductor part being mounted on at least one of top and bottom surfaces of said substrate;

said semiconductor part includes a semiconductor chip, leads arranged radially around said semiconductor chip, wires connecting said semiconductor chip and said leads, and a synthetic resin package portion for sealing said semiconductor chip, said leads and said wires substantially within the periphery thereof, said leads and said wires having approximately the same length, said lead having a total length extending substantially within the periphery of said package portion and an approximately constant width over said total length thereof, the leads located at the centers of the sides of said semiconductor chip having diamond-shaped portions, respectively, and the other leads having V-shaped portions, respectively, said V-shaped portions being formed with bending angles so as to bend in conformity with bent outlines of said diamond-shaped portions, respectively, such that said bending angles of said V-shaped portions are substantially identical, said leads being coupled to said terminals;

said terminals comprise fixed terminal pins projecting from one of the top and bottom surfaces of said substrate and extending generally in one direction, so that said circuit module is electrically and mechanically connectable to the board of the computer by said fixed terminal pins.

2. The circuit module as claimed in claim 1 wherein said central processing unit is arranged at a central portion on the top surface of said substrate, said memory circuit part is arranged at a portion on the bottom surface of said substrate in a vicinity of said central processing unit, and said memory circuit part has a dynamic random access memory arranged at a portion in a vicinity of an edge of said substrate.

3. The circuit module as claimed in claim 1, wherein inner ends of said leads are arranged so that an imaginary-line, which imaginary-line is formed by successively connecting said inner ends of said leads, is bent so as to form at least a part of a rectangular shape, four corners of which rectangular shape are chamfered, at least one of the chamfered corners being included within said imaginary-line, which rectangular shape surrounds said semiconductor chip.

4. The circuit module as claimed in claim 1, wherein:
said semiconductor chip is bonded on a stage having a plane shape; and
an extension portion for grounding said stage is provided on said stage so that said extension portion extends outside said stage from a side of said stage.

* * * * *